United States Patent [19]
Omori

[11] Patent Number: 5,999,112
[45] Date of Patent: Dec. 7, 1999

[54] DATA COMPRESSION APPARATUS AND METHOD, DATA EXPANSION APPARATUS AND METHOD, AND RECORDING MEDIUM

[75] Inventor: Mutsuhiro Omori, Kanagawa, Japan

[73] Assignee: Sony Corporation, Tokyo, Japan

[21] Appl. No.: 08/996,106

[22] Filed: Dec. 22, 1997

[30] Foreign Application Priority Data

Dec. 27, 1996 [JP] Japan ................................. 8-350463

[51] Int. Cl.$^6$ .............................. H03M 7/30; G06K 9/36
[52] U.S. Cl. ............................................. 341/76; 382/241
[58] Field of Search ................. 341/65, 67, 50, 341/76, 51, 52, 106; 382/241, 242, 236, 238

*Primary Examiner*—Brian Young
*Assistant Examiner*—Peguy Jean Pierre
*Attorney, Agent, or Firm*—Fulwider Patton Lee & Utecht, LLP

[57] ABSTRACT

In the data compression method and apparatus, difference value data each consisting of m bits that include an absolute value represented by m−1 bits and a 1-bit sign bit representing a sign are received, each of the difference value data having been obtained by calculating a difference between data to be coded and data immediately preceding it. N of the received difference value data are rearranged on a bit-by-bit basis, to generate a bit sequence in which bits at the same place of the n difference value data appear consecutively in predetermined order. A coded bit sequence is generated by compressing the generated bit sequence by a predetermined compression method. In the data expansion apparatus and method, a bit sequence of consecutive bits is generated by expanding a coded bit sequence by a decoding method corresponding to a predetermined compression method. Difference value data each consisting of m bits that include an absolute value represented by m−1 bits and a 1-bit sign bit representing a sign are restored from the expanded second bit sequence, and restored data is generated by performing, using the sign bit, an operation on data to be restored and data that has been restored immediately before it.

25 Claims, 6 Drawing Sheets

DATA COMPRESSION APPARATUS AND METHOD, DATA EXPANSION APPARATUS AND METHOD, AND RECORDING MEDIUM

BACKGROUND OF THE INVENTION

1. Field of the Invention

The present invention relates to a data compression apparatus and method, a recording medium, and a data expansion apparatus and method. In particular, the invention relates to a data compression apparatus and method, a recording medium, and a data expansion apparatus and method which compress consecutive data efficiently, i.e., at a high compression ratio, and store or expand compressed data.

2. Description of the Related Art

In storing a large amount of data such as graphics data on a recording medium such as an optical disc, it is a common procedure to compress the data and record compressed data. The compressed data are expanded in using the data.

Figure 1:
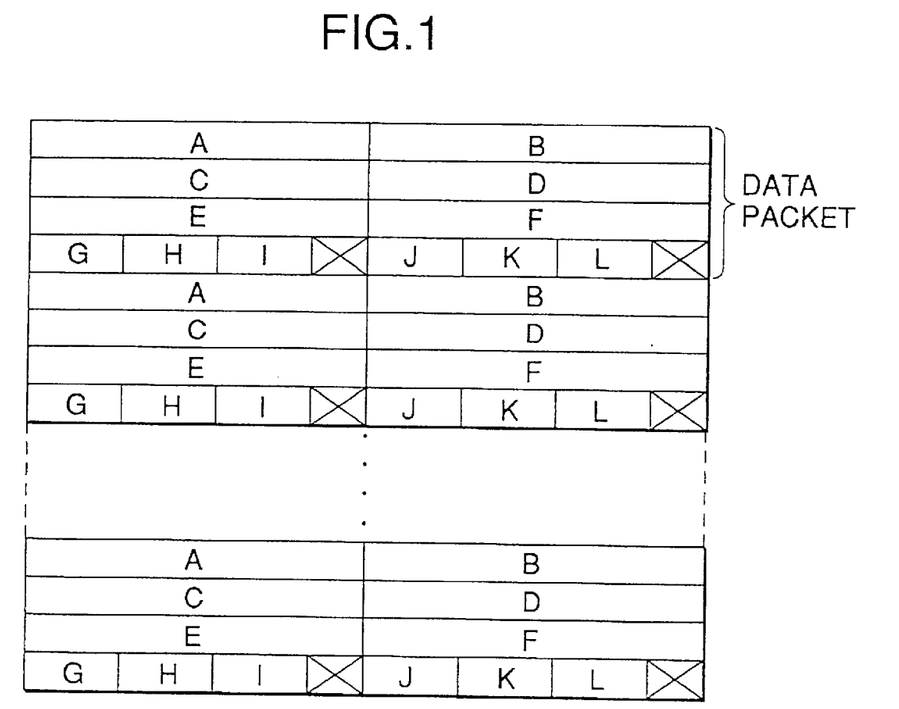
FIG. 1 shows an example of consecutive data packets.

For example, where data packets each consisting of data A to L occur consecutively as shown in FIG. 1, those data are sequentially compressed according to a predetermined compression scheme and compressed data are recorded on a recording medium or transferred via a predetermined transmission line.

However, in compressing, for instance, data (coordinate values, luminance values, etc.) corresponding to apices of polygons that are used in computer graphics, a sufficiently high compression ratio is not obtained if the run-length method is applied to the data themselves. Further, since data of this type is low in the degree of unevenness in a frequency profile, a sufficiently high compression ratio is not be obtained by a method that utilizes frequency-based classification such as DCT (discrete cosine transformation). Therefore, transfer or storage of data of this type requires high-speed transfer processing or a recording area of a large capacity, resulting in a difficulty in reducing the cost.

Where a low-speed transmission line or a recording area of a small capacity, the amount of data needs to be reduced by for instance, lowering image resolution, resulting in a difficulty in rendering graphic images with good image quality.

OBJECT AND SUMMARY OF THE INVENTION

The present invention has been made in view of the above circumstances, and an object of the invention is therefore to compress consecutively occurring data efficiently, i.e., at a high compression ratio, and store or expand compressed data.

According to one aspect of the invention, there is provided a data compression apparatus for generating a coded bit sequence by compressing a plurality of data that constitute a data set of a predetermined unit, comprising a receiving section for receiving difference value data each consisting of m bits that include an absolute value represented by m−1 bits and a 1-bit sign bit representing a sign, each of the difference value data having been obtained by calculating a difference between data to be coded and data immediately preceding it; a bit sequence generating section for rearranging, on a bit-by-bit basis, n of the difference value data that have been received by the receiving section, thereby generating a bit sequence in which bits at the same place of the n difference value data appear consecutively in predetermined order; and a compressing section for generating a coded bit sequence by compressing the bit sequence generated by the bit sequence generating section by a predetermined compression method.

There is also provided a data compression method for generating a coded bit sequence by compressing a plurality of data that constitute a data set of a predetermined unit, comprising the steps of receiving difference value data each consisting of m bits that include an absolute value represented by m−1 bits and a 1-bit sign bit representing a sign, each of the difference value data having been obtained by calculating a difference between data to be coded and data immediately preceding it; rearranging n of the received difference value data on a bit-by-bit basis, thereby generating a bit sequence in which bits at the same place of the n difference value data appear consecutively in predetermined order; and generating a coded bit sequence by compressing the generated bit sequence by a predetermined compression method.

According to another aspect of the invention, there is provided a data expansion apparatus for expanding a coded bit sequence generated by compression according to a predetermined compression scheme, wherein the coded bit sequence has been generated by collecting n difference value data each consisting of m bits that include an absolute value represented by m−1 bits and a 1-bit sign bit representing a sign, each of the n difference value data having been obtained by calculating a difference between data to be coded and data immediately preceding it, rearranging the n difference value data on a bit-by-bit basis, to thereby generate a first bit sequence in which bits at the same place of the n difference value data appear consecutively in predetermined order, and compressing the generated first bit sequence by a predetermined compression method, the data expansion apparatus comprising an expanding section for generating a second bit sequence of consecutive bits by expanding the coded bit sequence by a decoding method corresponding to the predetermined compression method; and a converting section for restoring, from the second bit sequence expanded by the expanding section, difference value data each consisting of m bits that include an absolute value represented by m−1 bits and a 1-bit sign bit representing a sign, and generating restored data by performing, using the sign bit, an operation on data to be restored and data that has been restored immediately before it.

There is also provided a data expansion method for expanding a coded bit sequence generated by compression according to a predetermined compression scheme, wherein the coded bit sequence has been generated by collecting n difference value data each consisting of m bits that include an absolute value represented by m−1 bits and a 1-bit sign bit representing a sign, each of the n difference value data having been obtained by calculating a difference between data to be coded and data immediately preceding it, rearranging the n difference value data on a bit-by-bit basis, to thereby generate a first bit sequence in which bits at the same place of the n difference value data appear consecutively in predetermined order, and compressing the generated first bit sequence by a predetermined compression method, the data expansion method comprising the steps of generating a second bit sequence of consecutive bits by expanding the coded bit sequence by a decoding method corresponding to the predetermined compression method; and restoring, from the expanded second bit sequence, difference value data each consisting of m bits that include an absolute value represented by m−1 bits and a 1-bit sign bit representing a sign, and generating restored data by performing, using the sign bit, an operation on data to be restored and data that has been restored immediately before it.

According to a further aspect of the invention, there is provided a recording medium capable of being played back by a machine and containing a recording signal that has a coded bit sequence obtained by compressing a plurality of data that constitute a data set of a predetermined unit, the coded bit sequence being obtainable by executing the steps of receiving difference value data each consisting of m bits that include an absolute value represented by m−1 bits and a 1-bit sign bit representing a sign, each of the difference value data having been obtained by calculating a difference between data to be coded and data immediately preceding it; rearranging n of the received difference value data on a bit-by-bit basis, thereby generating a bit sequence in which bits at the same place of the n difference value data appear consecutively in predetermined order; and generating a coded bit sequence by compressing the generated bit sequence by a predetermined compression method.

DETAILED DESCRIPTION OF THE PREFERRED EMBODIMENTS

Figure 2:
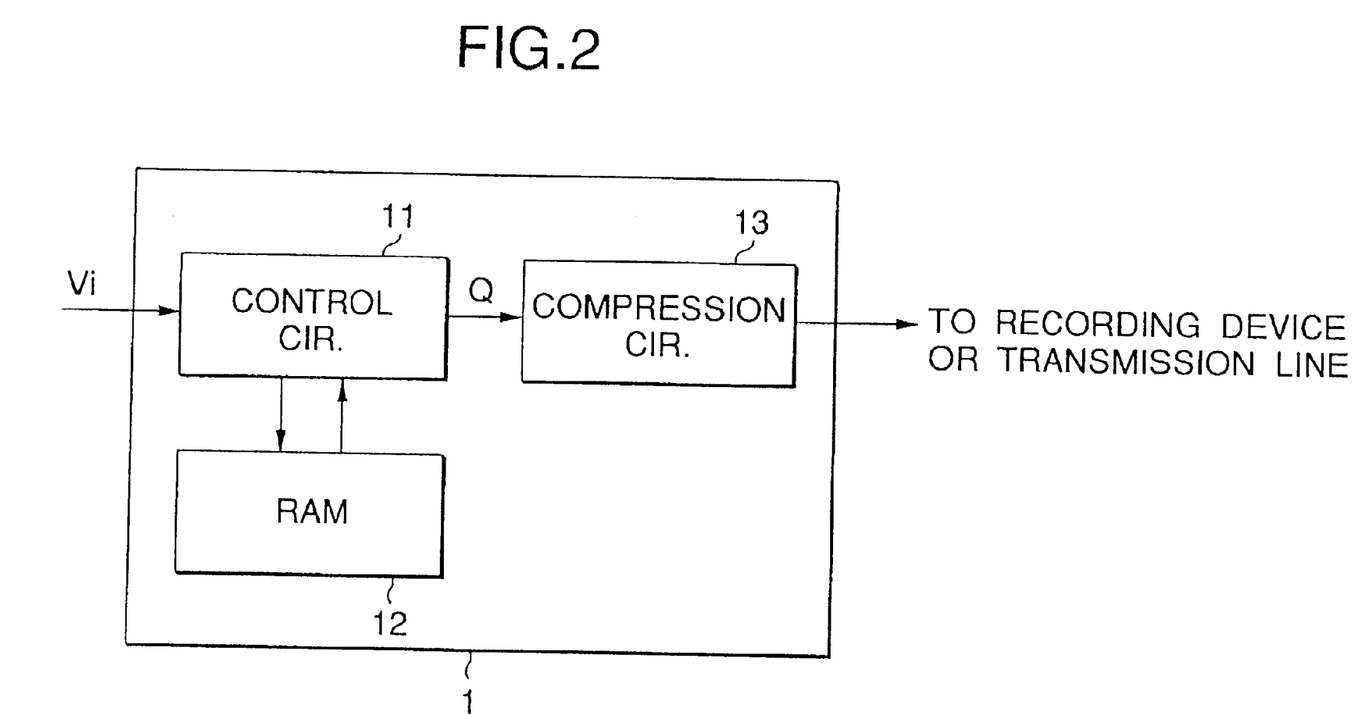
FIG. 2 is a block diagram showing the configuration of a data compression apparatus according to an embodiment of the present invention.

FIG. 2 shows the configuration of a data compression apparatus according to an embodiment of the invention. In the data compression apparatus 1, a control circuit 11 is sequentially supplied with data Vi (i=0, 1, ... ) in which the LSB (least significant bit) is a sign bit and the second bit to the MSB (most significant bit) represent an absolute value. The data Vi are temporarily stored in a RAM 12, and a bit sequence Q is generated in units of n data (data V0 to Vn−1) in such a manner that data V0 to Vn−1 are rearranged on a bit-by-bit basis so that bits of the same place appear consecutively. The bit sequence Q is output to a compression circuit 13. It is noted that the value of data Vi is set at a difference value (V' i−V' i−1n) between an actual value V' i of data Vi and an actual value V' i−1 of the preceding data Vi−1.

The compression circuit 13 compresses the bit sequence Q that is supplied from the control circuit 11 according to a predetermined compression scheme and outputs compressed data to a recording device (not shown) for recording data on a predetermined recording medium or to transmission line (not shown) for transferring data to a predetermined apparatus.

Figure 3:
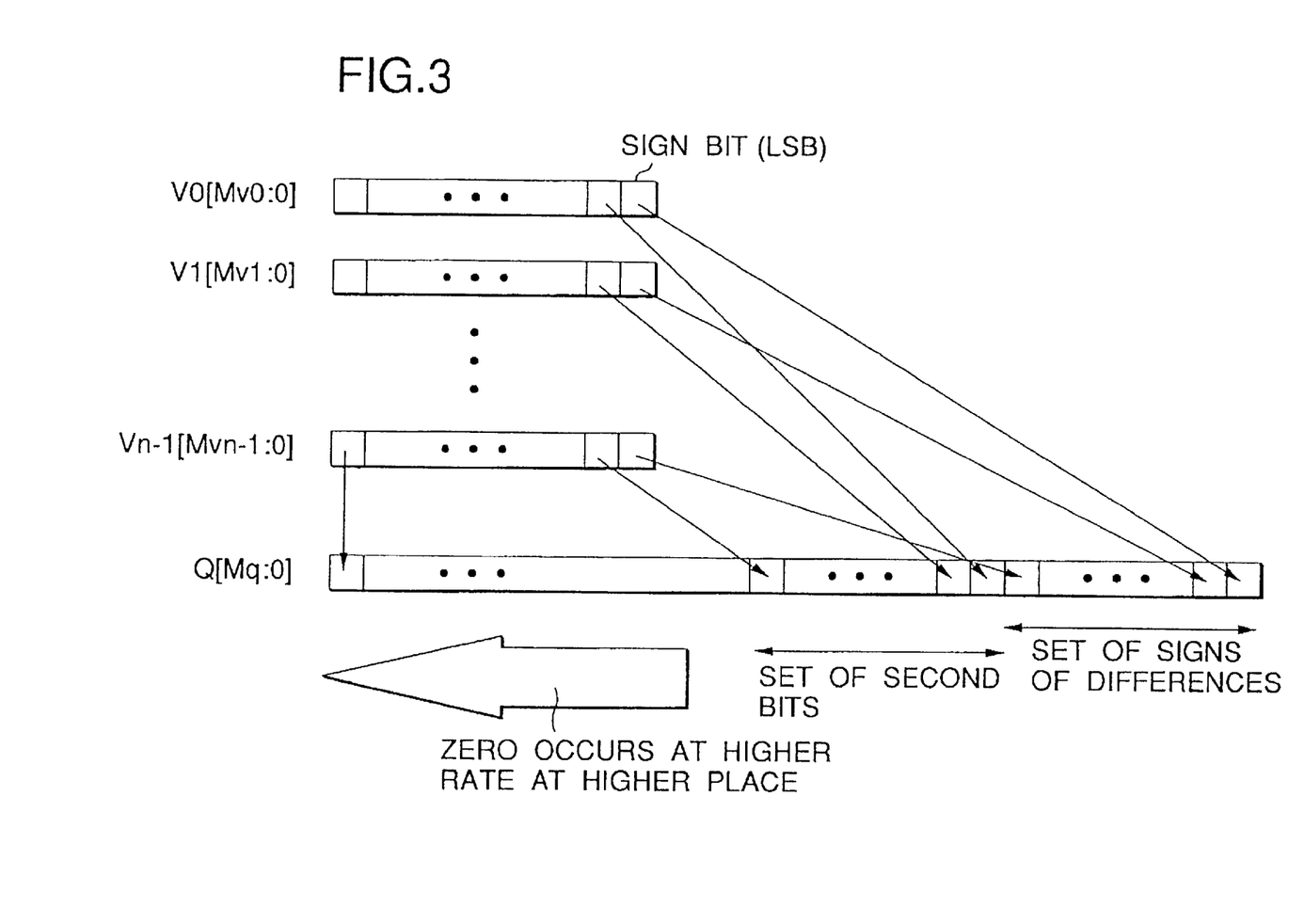
FIG. 3 illustrates an example of data rearrangement in the data compression apparatus of FIG. 2.

Next, the operation of the data compression apparatus 1 of FIG. 2 will be described. The control circuit 11 sequentially stores, in the RAM 12, data Vi (i=0, 1, ... ) in which the LSB (first bit) is a sign bit and the second bit to the MSB represent an absolute value. As shown in FIG. 3, the control circuit 11 generates a bit sequence Q in units of n data (data V0 to Vn−1) in such a manner that data V0 to Vn−1 are rearranged on a bit-by-bit basis so that bits of the same place appear consecutively, and outputs the bit sequence Q to the compression circuit 13.

That is, as shown in FIG. 3, the LSBs of data V0 to Vn−1 are arranged as the LSB to the nth bit of a bit sequence Q. The second bits of data V0 to Vn−1 are arranged as the (n+1)th bit to the 2nth bit of the bit sequence Q. Similarly, the ith bits among the third bits to the MSBs of data V0 to Vn−1 are arranged as the ((i−1)×n+1)th bit to the (i×n)th bit of the bit sequence Q.

In this case, an actual value V' i of data Vi is supplied to the control circuit 11 every predetermined number of data or only at the first time. Since data subsequent to data Vi are expressed in a differential manner by using an absolute value V' i of data Vi as a reference value, data can be divided every time an actual value V' i of data Vi is supplied.

Where each data is expressed as a difference from the immediately preceding data, absolute values of difference values are small if actual values V' i of data have a small variation. Therefore, a value 0 appears at a high rate in upper bits of the data (difference values), and hence the data amount can easily be reduced by using the run-length method, for instance.

Since data Vi are difference values, positive numbers and negative numbers should appear at approximately equal rates. If data (difference values) are expressed by, for instance, 2's complements, many 0s appear in upper bits if the absolute value of data is a small positive number and many 1s appear in upper bits if it is a small negative number, and hence a run in the bit sequence Q becomes short. In the invention, to cause a value 0 to always appear at a high rate in upper bits, data Vi is expressed by an absolute value and a sign bit.

Since the value of the sign bit tends to change from one data to another, the LSB is used as the sign bit to prevent runs from becoming short in upper bits.

For example, where triangles are used as polygons in graphics data, coordinates of the respective apices of each polygon are not much different from each other. Therefore, the compression ratio, i.e., (original data amount)/(data amount after compression), can be made high by employing the above-mentioned differential expression. Where a larger number of, i.e., finer, polygons are to be rendered, coordinates, luminance values, texture coordinates (described later), etc. corresponding to the respective apices of each polygon have closer values. Therefore, absolute values of difference values becomes smaller and a value 0 appears more frequently in upper bits. The compression ratio can thus been increased.

After compressing the bit sequence Q that is supplied from the control circuit 11 according to the predetermined compression scheme, the compression circuit 13 outputs compressed data to a recording device (not shown) for recording data on a predetermined recording medium or to transmission line (not shown) for transferring data to a predetermined apparatus. For example, the compression circuit 13 compresses the bit sequence Q by the run-length method, and further compresses resulting compressed data by using a variable length coding method such as the Huffman coding. The compression ration can further be increased in this manner.

Figure 4:
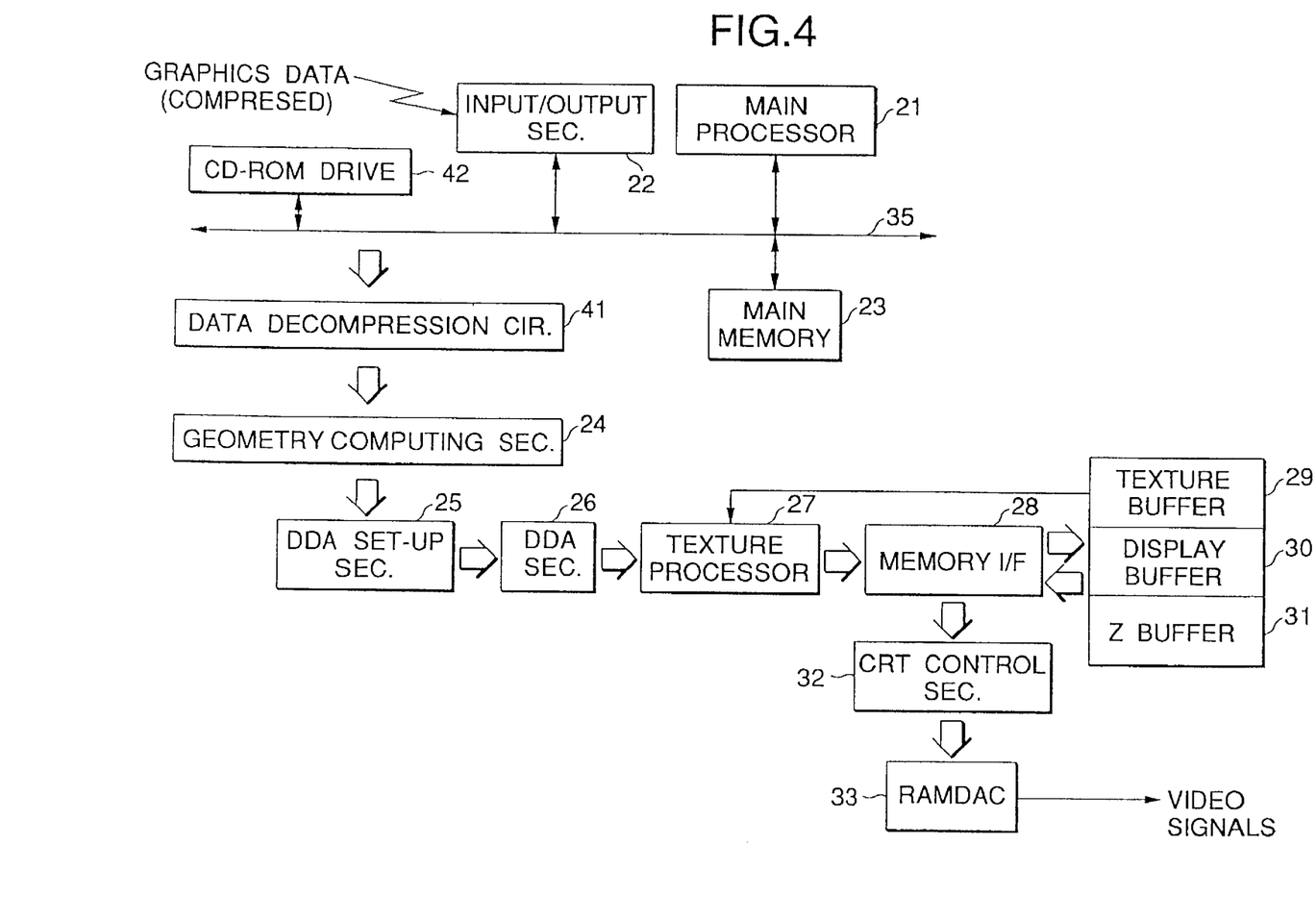
FIG. 4 is a block diagram showing an exemplary configuration of a rendering apparatus that utilizes a data expansion apparatus according to the invention.

FIG. 4 shows an exemplary configuration of a rendering apparatus that utilizes a data expansion apparatus according to the invention.

A main processor 21 performs various kinds of processing. That is, the main processor 21 outputs, to a data decompression circuit 41, graphics data that are supplied from via an input/output section 22. Further, the main processor 21 causes a CD-ROM drive to read out data (for instance, data compressed by the data compression apparatus of FIG. 2) that are stored in a specified CD-ROM (compact disc-read only memory) and to output the read-out data to the data decompression circuit 41.

For example, the graphics data are data of a three-dimensional object that is expressed by putting two-dimensional fundamental figures (polygons).

The data decompression circuit 41 expands data compressed by, for instance, the data compression apparatus 1 of FIG. 2 in the manner as described above (i.e., compressed data of a bit sequence Q), restores data Vi (difference values) from the expanded bit sequence Q, calculates an actual value V' i of each data Vi based on V' i and an actual value V' i−1 of the immediately preceding data Vi−1, and sequentially output the calculated actual values to the geometry computing section 24.

Figure 5:
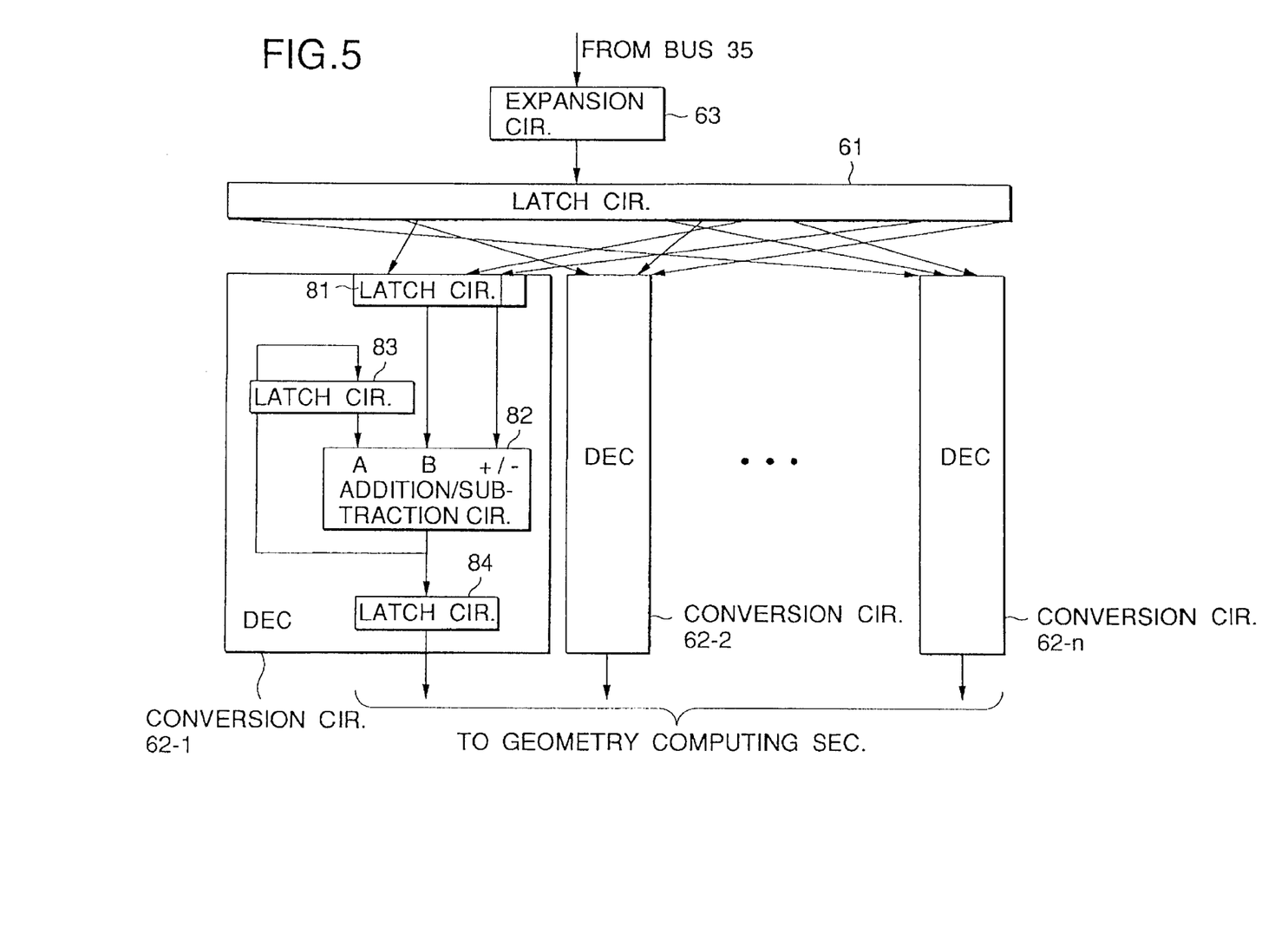
FIG. 5 is a block diagram showing an exemplary configuration of a data decompression circuit shown in FIG. 4.

FIG. 5 shows an exemplary configuration of the data decompression circuit 41. An expansion circuit 63 expands, according to an expansion scheme corresponding to the compression scheme of the compression circuit 13 shown in FIG. 2, data that are supplied via a bus 35, and outputs an expanded bit sequence Q to a latch circuit 61.

The latch circuit 61 outputs, to a latch circuit 81 of a conversion circuit 62-1, bits corresponding to data V0 in that part of the bit sequence Q which corresponds to n data Vi, i.e., the (j×n+1)th bits of the bit sequence Q (j=0, ..., L−1; L is a bit length of the data). Similarly, the latch circuit 61 outputs, to a latch circuit 81 of a conversion circuit 62-(i+1), bits corresponding to data Vi (i=1, ..., n−1) in the same part of the bit sequence Q, i.e., the (j×n+i+1)th bits of the bit sequence Q.

In the conversion circuit 62-i, the latch circuit 81 holds data that is supplied from the latch circuit 61 until receiving the next data, and outputs, to an addition/subtraction circuit 82, the LSB (i.e., sign bit) of the data being held and the second bit to MSB as a sign flag and data B, respectively.

A latch circuit 83 supplies the addition/subtraction circuit 82 with an immediately preceding output of the addition/subtraction circuit 82 as data A. The addition/subtraction circuit 82 calculates A+B or A−B based on data A and B in accordance with the value of the sign flag that is supplied from the latch circuit 81, and outputs a calculation result to the latch circuit 83 and a latch circuit 84.

The addition/subtraction circuit 82 calculates exclusive OR of each bit of data B and its sign flag value (0 for "+" and 1 for "−"), and then calculates the sum of a result of the above calculation, data A, and its sign flag. In this manner, the addition/subtraction circuit 82 calculates A+B if the sign flag of data B is 0, and calculates A−B (A+(2's complement of B) if it is 1.

The latch circuit 84 of the conversion circuit 62-i holds data that is supplied from the addition/subtraction circuit 82 until receiving the next data, and outputs the data being held to the geometry computing section 24.

The geometry computing section 24 performs coordinate conversion, clipping, lighting, etc. on received graphics data, and outputs, to a DDA set-up section 25, as processed graphics data (i.e., polygon rendering data), coordinate values X, Y, and Z, luminance values Cr, Cg, and Cb of red, green, and blue, a blending coefficient α that represents a ratio of blending luminance values of pixels to be drawn and pixel luminance values stored in a display buffer 30, texture coordinates S, T, and Q, and a fog coefficient F all of which correspond to each apex of a polygon.

Although S, T, and Q on a homogeneous coordinate system are output as texture coordinates, S/Q and T/Q each multiplied by a texture size are used as actual texture coordinates. The fog coefficient F indicates the degree of blending a given fog color in, for instance, displaying points having large Z values in a foggy expression.

Based on the received polygon rendering data X, Y, Z, Cr, Cg, Cb, α, S, T, Q, and F of each apex of the polygon, the DDA set-up section 25 calculates variations $\Delta Z/\Delta X$, $\Delta Cr/\Delta X$, $\Delta Cg/\Delta X$, $\Delta Cb/\Delta x$, $\Delta\alpha/\Delta X$, $\Delta S/\Delta X$, $\Delta T/\Delta X$, $\Delta Q/\Delta X$, and $\Delta F/\Delta X$ of the polygon rendering parameters with respect to the X direction, as well as variations $\Delta Z/\Delta Y$, $\Delta Cr/\Delta Y$, $\Delta Cg/\Delta Y$, $\Delta Cb/\Delta Y$, $\Delta\alpha/\Delta Y$, $\Delta S/\Delta Y$, $\Delta T/\Delta Y$, $\Delta Q/\Delta Y$, and $\Delta F/\Delta Y$ of the polygon rendering parameters with respect to the Y direction.

Further, the DDA set-up section 25 judges the type of a triangle shape based on the coordinate values of the respective apices of the polygon (triangle). After temporarily moving the coordinate values of the rendering start point of the polygon (triangle) to a point $(X_0, Y_0)$ (see FIG. 6) on a side AC that has the same Y coordinate value as a span (an array of pixels arranged in the X direction; see FIG. 6) closest to the rendering start point of the polygon, the DDA set-up section 5 calculates initial values of the respective polygon rendering parameters corresponding to the point $(X_0, Y_0)$ and outputs those to a DDA section 26 together with the variations with respect to the X direction.

Further, the DDA set-up section 25 sequentially calculates, by interpolation, data values of that point on the side AC which corresponds to the span to be processed by the DDA section 26 based on the data values and the variations with respect to the Y direction at the point $(X_0, Y_0)$, and outputs those to the DDA section 26.

First, based on the variations with respect to the X direction and the initial values (at the point on the side AC) of the respective polygon rendering parameters that are both supplied from the DDA set-up section 25, the DDA section 26 calculates values of the respective polygon rendering parameters corresponding to the pixel of the start point of the span by performing a DDA (digital differential analyzer) operation. Then, the DDA section 26 sequentially calculates coordinate values X and Y corresponding to the respective pixels of the span and values of the respective polygon rendering parameters Z, Cr, Cg, Cb, α, S, T, Q, and F at the coordinates (X, Y), and outputs those to a texture processor 27.

The texture processor 27 reads out texture data from a texture buffer 29, and calculates actual texture coordinate values by dividing received texture coordinate values S and T by Q and multiplying a quotient by a texture size. Based on the read-out texture data, the texture processor 27 calculates luminance values at a texture address corresponding to the actual texture coordinate values S and T and a coefficient (texture a value) representing a blending ratio of the texture data. Further, the texture processor 27 blends luminance values supplied from the DDA section 26 and texture luminance values in accordance with the calculated coefficient.

Further, the texture processor 27 blends a given fog color with the above-calculated luminance values in accordance with the fog coefficient F, and outputs, together with the coordinate values X, Y, and Z and the blending coefficient a, thus-generated luminance values to a memory interface 28 as luminance values of a pixel having the coordinate values X and Y that are supplied from the DDA section 26.

The texture buffer 29 stores in advance texture data corresponding to each level such as MIPMAP.

The memory interface 28 refers to a Z value of a Z buffer 31, and, if the received pixel is closer to the viewing point than the previously drawn pixels are, updates the Z value of the Z buffer 31 to the received coordinate value Z and writes the received luminance values to the display buffer 30 at an address corresponding to the coordinates (X, Y).

Where the memory interface 28 is set so as to perform a blending, the memory interface 28 blends the luminance values stored in the display buffer 30 and the received luminance values in accordance with the received blending coefficient a and writes generated luminance values to the display buffer 30.

A CRT control section 32 generates display addresses in synchronism with given horizontal and vertical sync signals, and controls the memory interface 28 to have it transfer luminance values corresponding to the display addresses a specified number of luminance values at a time. The CRT control section 32 temporarily stores the received luminance values in an internal FIFO section (not shown), and outputs index values of those data to a RAMDAC 33 at predetermined intervals.

The RAMDAC 33 has a RAM section and a DAC (digital/analog converter) section (both not shown). The RAM section stores in advance luminance values corresponding to respective index values. Luminance values corresponding to index values that are supplied from the CRT control section 32 are supplied from the RAM section to the DAC section. The luminance values (RGB values) are D/A-converted by the DAC section, and resulting analog video signals (RGB signals) are output to a predetermined apparatus (not shown).

Next, the operation of the rendering apparatus of FIG. 4 will be described.

The main processor 21 outputs (compressed) graphics data that are supplied via the input/output section 22 or read out from a CD-ROM by the CD-ROM drive 42 in accordance with a given application program to the data decompression circuit 41 via the bus 35.

The expansion circuit 63 of the data decompression circuit 41 expands the received data by a proper method that corresponds to the compression scheme of the data, and outputs an expanded bit sequence Q to the latch circuit 61.

The latch circuit 61 outputs, to the latch circuit 81 of the conversion circuit 62-1, bits corresponding to data V0 in that part of the bit sequence Q which corresponds to n data Vi, i.e., the (j×n+1)th bits of the bit sequence Q (j=0, ..., L−1; L is a bit length of the data). Similarly, the latch circuit 61 outputs, to the latch circuit 81 of the conversion circuit 62-(i+1), bits corresponding to data Vi (i=1, ..., n−1) in the same part of the bit sequence Q, i.e., the (j×n+i+1)th bits of the bit sequence Q.

In the conversion circuit 62-i, the latch circuit 81 holds data that is supplied from the latch circuit 61 until receiving the next data, and outputs, to the addition/subtraction circuit 82, the LSB (i.e., sign bit) of the data being held and the second bit to MSB as a sign flag and data B, respectively.

The addition/subtraction circuit 82 employs, as data A, the immediately preceding output V' i−1 of itself that is supplied from the latch circuit 83, and calculates A+B or A−B based on data A and data B (=|Vi|) in accordance with the value of the sign flag that is supplied from the latch circuit 81. The addition/subtraction circuit 82 outputs a calculation result to the latch circuits 83 and 84.

In the above manner, actual values V' i are sequentially calculated from the received difference values Vi.

The latch circuit 84 of the conversion circuit 62-i holds data that is supplied from the addition/subtraction circuit 82 until receiving the next data, and outputs the data being held to the geometry computing section 24. In this embodiment, polygon data of three-dimensional graphics are supplied to the geometry computing section 24.

The geometry computing section 24 performs coordinate conversion, clipping, lighting, etc. on graphics data that are supplied from the data decompression circuit 41, and outputs, to the DDA set-up section 25, coordinate values X, Y, and Z, luminance values Cr, Cg, and Cb of red, green, and blue, a blending coefficient α, texture coordinates S, T, and Q, and a fog coefficient F all of which correspond to each apex of a polygon.

As a pre-process of rendering, first the DDA set-up section 25 judges the shape of the polygon (triangle). In doing so, the DDA set-up section 25 sets an apex having the smallest Y coordinate value among the three apices as apex A, sets an apex having the largest Y coordinate value as apex C, and sets the remaining apex as apex B. If there are two apices having the smallest Y coordinate value in the three apices, the DDA set-up section 25 sets one of the two apices as apex A and sets the other as apex B.

Further, the DDA set-up section 25 calculates, based on the polygon rendering data of the three apices of the polygon, variations of the polygon rendering parameters with respect to the X and Y directions that will be used for calculating values of the polygon rendering data parameters X, Y, Z, Cr, Cg, Cb, α, S, T, Q, and F at each pixel in the polygon by interpolation.

Figure 6:
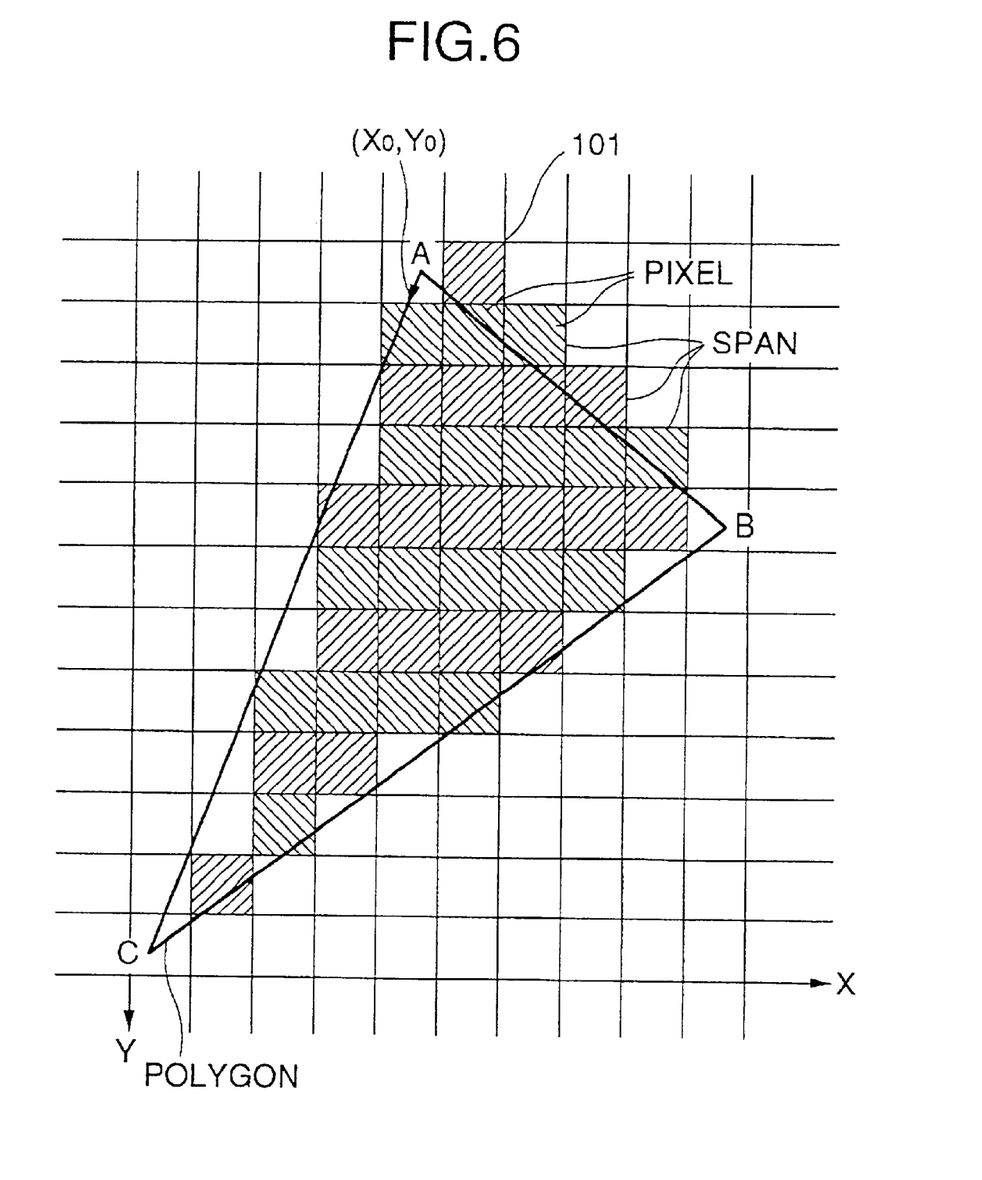
FIG. 6 shows an example of a polygon.

After the calculation of the respective variations, the DDA set-up section 25 temporarily moves the rendering initial point of the polygon to a point $(X_0, Y_0)$ on a side AC that has the same Y coordinate $Y_0$ as a span 101 that is closest to apex A (see FIG. 6). Then, the DDA set-up section 25 calculates values of the respective polygon rendering parameters corresponding to those coordinate values by interpolation, and outputs the calculated values to the DDA section 26 together with the variations with respect to the X direction. Thereafter, the DDA set-up section 25 sequentially calculates, by interpolation, values of the polygon rendering parameters at a point on the side AC corresponding to each span, and sequentially outputs the calculated values to the DDA section 26. Each pixel in FIG. 6 is represented by coordinate values of the bottom-left corner of the pixel.

The DDA section 26 performs a DDA operation, thereby executing a rendering process on a span corresponding to data that are supplied from the DDA set-up section 25. The DDA section 26 sequentially outputs polygon rendering data corresponding to respective pixels that have been subjected to the rendering process to the texture processor 27.

The texture processor 27 reads out texture data from the texture buffer 29. Using the texture data, the texture processor 27 converts texture coordinate values that are supplied from the DDA section 26 into actual texture coordinate values, and calculates a coefficient (texture a value) that represents a blending ratio between luminance values at a texture address corresponding to the actual texture coordinate values S and T and the texture data. In accordance with the calculated coefficient, the texture processor 27 blends the luminance values and the texture luminance values.

Further, the texture processor 27 blends, in accordance with the fog coefficient F, a proper fog color with the luminance values that have been obtained by blending in accordance with the texture α value. The texture processor 27 outputs, together with coordinate values X, Y, and Z and the blending coefficient α, generated luminance values to the memory interface 28 as luminance values corresponding to a pixel having the coordinate values X and Y that are supplied from the DDA section 26.

The memory interface 28 reads out a Z value of the Z buffer 31, and judges whether the pixel supplied from the texture processor 27 is closer to the viewing point than the previously drawn pixels are. If the received pixel is closer to the viewing point than the previously drawn pixels are, the memory interface 28 updates the Z value of the Z buffer 31 to the received coordinate value Z and writes the received luminance values to the display buffer 30 at an address corresponding to the coordinates of the received pixel.

On the other hand, if the received pixel exists behind the previously drawn pixels, the memory interface 28 discards the received data.

Where the memory interface 28 is set so as to perform a blending, the memory interface 28 blends the luminance values stored in the display buffer 30 and the received luminance values in accordance with the blending coefficient a supplied from the texture processor 27, i.e., at a ratio of α:(1−α), and writes generated luminance values to the display buffer 30.

The luminance values that have been written to the display buffer 30 are transferred to the CRT control section 32 via the memory interface 28 in accordance with display addresses that are generated by the CRT control section 32 in synchronism with horizontal and vertical sync signals, and temporarily stored in the FIFO section of the CRT control section 32. Then, index values corresponding to those luminance values are output at predetermined intervals to the RAMDAC 33, which outputs analog video signals (RGB signals) obtained by D/A-converting luminance values corresponding to the index values to a predetermined apparatus (not shown).

Although in the above embodiment the data expansion apparatus of the invention is applied to the rendering apparatus, naturally it can also be applied to other apparatuses.

Although the above embodiment uses the CD-ROM as a recording medium, other types of recording media can also be used. In such a case, a playback device corresponding to the recording medium used needs to be provided in place of the CD-ROM drive 42.

As described above, according to the invention, in a data compression apparatus and method for generating a coded bit sequence by compressing a plurality of data that constitute a data set of a predetermined unit, difference value data each consisting of m bits that include an absolute value represented by m−1 bits and a 1-bit sign bit representing a sign are received, each of the difference value data having been obtained by calculating a difference between data to be coded and data immediately preceding it. N of the received difference value data are rearranged on a bit-by-bit basis, to generate a bit sequence in which bits at the same place of the n difference value data appear consecutively in predetermined order. A coded bit sequence is generated by compressing the generated bit sequence by a predetermined compression method. Therefore, data can be compressed efficiently, i.e., at a high compression ratio.

In a data expansion apparatus and method for expanding a coded bit sequence generated by compression according to a predetermined compression scheme, a bit sequence of consecutive bits is generated by expanding the coded bit sequence by a decoding method corresponding to the above, predetermined compression method. Difference value data each consisting of m bits that include an absolute value represented by m−1 bits and a 1-bit sign bit representing a sign are restored from the expanded second bit sequence, and restored data is generated by performing, using the sign bit, an operation on data to be restored and data that has been restored immediately before it. Therefore, compressed data that have been compressed efficiently, i.e., at a high compression ratio, can be expanded.

Further, in a recording medium capable of being played back by a machine, a recording signal that is recorded on the recording medium can be obtained by receiving difference value data each consisting of m bits that include an absolute value represented by m−1 bits and a 1-bit sign bit representing a sign, each of the difference value data having been obtained by calculating a difference between data to be coded and data immediately preceding it, rearranging n of the received difference value data on a bit-by-bit basis, to thereby generate a bit sequence in which bits at the same place of the n difference value data appear consecutively in predetermined order, and compressing the generated bit sequence by a predetermined compression method. Therefore, the recording medium can record a large amount of data.

As various modifications and application forms are conceivable without departing from the spirit and scope of the invention, it should be understood that the invention is not limited to the specific embodiments described above.

What is claimed is:

1. A data compression apparatus for generating a coded bit sequence by compressing a plurality of data that constitute a data set of a predetermined unit, comprising:

a receiving section for receiving difference value data each consisting of m bits that include an absolute value represented by m−1 bits and a 1-bit sign bit representing a sign, each of the difference value data having been obtained by calculating a difference between data to be coded and data immediately preceding it;

a bit sequence generating section for rearranging, on a bit-by-bit basis, n of the difference value data that have been received by the receiving section, thereby generating a bit sequence in which bits at the same place of the n difference value data appear consecutively in predetermined order; and a compressing section for generating a coded bit sequence by compressing the bit sequence generated by the bit sequence generating section by a predetermined compression method.

2. The data compression apparatus according to claim 1, wherein the data set of the predetermined unit is a data set corresponding to apex data of polygon data.

3. The data compression apparatus according to claim 1, wherein the predetermined compression method is a run-length coding method.

4. The data compression apparatus according to claim 1, wherein the sign bit is located at an LSB of each of the difference value data.

5. The data compression apparatus according to claim 1, wherein the bit sequence generating section generates a bit sequence in which bits appear consecutively in order from LSBs.

6. A data compression method for generating a coded bit sequence by compressing a plurality of data that constitute a data set of a predetermined unit, comprising the steps of:

receiving difference value data each consisting of m bits that include an absolute value represented by m−1 bits and a 1-bit sign bit representing a sign, each of the difference value data having been obtained by calculating a difference between data to be coded and data immediately preceding it;

rearranging n of the received difference value data on a bit-by-bit basis, thereby generating a bit sequence in which bits at the same place of the n difference value data appear consecutively in predetermined order; and generating a coded bit sequence by compressing the generated bit sequence by a predetermined compression method.

7. The data compression method according to claim 6, wherein the data set of the predetermined unit is a data set corresponding to apex data of polygon data.

8. The data compression method according to claim 6, wherein the predetermined compression method is a run-length coding method.

9. The data compression method according to claim 6, wherein the sign bit is located at an LSB of each of the difference value data.

10. The data compression method according to claim 6, wherein the bit sequence is generated so that bits appear consecutively in order from LSBs.

11. A data expansion apparatus for expanding a coded bit sequence generated by compression according to a predetermined compression scheme, wherein the coded bit sequence has been generated by collecting n difference value data each consisting of m bits that include an absolute value represented by m−1 bits and a 1-bit sign bit representing a sign, each of the n difference value data having been obtained by calculating a difference between data to be coded and data immediately preceding it, rearranging the n difference value data on a bit-by-bit basis, to thereby generate a first bit sequence in which bits at the same place of the n difference value data appear consecutively in predetermined order, and compressing the generated first bit sequence by a predetermined compression method, the data expansion apparatus comprising:

an expanding section for generating a second bit sequence of consecutive bits by expanding the coded bit sequence by a decoding method corresponding to the predetermined compression method; and a converting section for restoring, from the second bit sequence expanded by the expanding section, difference value data each consisting of m bits that include an absolute value represented by m−1 bits and a 1-bit sign bit representing a sign, and generating restored data by performing, using the sign bit, an operation on data to be restored and data that has been restored immediately before it.

12. The data expansion apparatus according to claim 11, wherein the data set of the predetermined unit is a data set corresponding to apex data of polygon data.

13. The data expansion apparatus according to claim 11, wherein the predetermined decoding method is a run-length decoding method.

14. The data expansion apparatus according to claim 11, wherein the sign bit is located at an LSB of each of the difference value data.

15. The data expansion apparatus according to claim 11, wherein the first bit sequence has been generated so that bits appear consecutively in order from LSBs.

16. A data expansion method for expanding a coded bit sequence generated by compression according to a predetermined compression scheme, wherein the coded bit sequence has been generated by collecting n difference value data each consisting of m bits that include an absolute value represented by m−1 bits and a 1-bit sign bit representing a sign, each of the n difference value data having been obtained by calculating a difference between data to be coded and data immediately preceding it, rearranging the n difference value data on a bit-by-bit basis, to thereby generate a first bit sequence in which bits at the same place of the n difference value data appear consecutively in predetermined order, and compressing the generated first bit sequence by a predetermined compression method, the data expansion method comprising the steps of:

generating a second bit sequence of consecutive bits by expanding the coded bit sequence by a decoding method corresponding to the predetermined compression method; and restoring, from the expanded second bit sequence, difference value data each consisting of m bits that include an absolute value represented by m−1 bits and a 1-bit sign bit representing a sign, and generating restored data by performing, using the sign bit, an operation on data to be restored and data that has been restored immediately before it.

17. The data expansion method according to claim 16, wherein the data set of the predetermined unit is a data set corresponding to apex data of polygon data.

18. The data expansion method according to claim 16, wherein the predetermined decoding method is a run-length decoding method.

19. The data expansion method according to claim 16, wherein the sign bit is located at an LSB of each of the difference value data.

20. The data expansion method according to claim 16, wherein the first bit sequence has been generated so that bits appear consecutively in order from LSBs.

21. A recording medium capable of being played back by a machine and containing a recording signal that has a coded bit sequence obtained by compressing a plurality of data that constitute a data set of a predetermined unit, the coded bit sequence being obtainable by executing the steps of:

receiving difference value data each consisting of m bits that include an absolute value represented by m−1 bits and a 1-bit sign bit representing a sign, each of the difference value data having been obtained by calculating a difference between data to be coded and data immediately preceding it;

rearranging n of the received difference value data on a bit-by-bit basis, thereby generating a bit sequence in which bits at the same place of the n difference value data appear consecutively in predetermined order; and generating a coded bit sequence by compressing the generated bit sequence by a predetermined compression method.

22. The recording medium according to claim 21, wherein the data set of the predetermined unit is a data set corresponding to apex data of polygon data.

23. The recording medium according to claim 21, wherein the predetermined compression method is a run-length coding method.

24. The recording medium according to claim 21, wherein the sign bit is located at an LSB of each of the difference value data.

25. The recording medium according to claim 21, wherein the bit sequence is generated so that bits appear consecutively in order from LSBs.

* * * * *